US 6,728,646 B2

(12) United States Patent
Howell et al.

(10) Patent No.: US 6,728,646 B2
(45) Date of Patent: Apr. 27, 2004

(54) ENERGY INFORMATION SYSTEM AND SUB-MEASUREMENT BOARD FOR USE THEREWITH

(75) Inventors: Donald Wayne Howell, Blue Ridge, VA (US); Frank Oakley Blevins, Salem, VA (US); Armand J. Tamagni, Jr., Troutville, VA (US)

(73) Assignee: Enerwise Global Technologies, Inc., Kennett Square, PA (US)

( * ) Notice: Subject to any disclaimer, the term of this patent is extended or adjusted under 35 U.S.C. 154(b) by 0 days.

(21) Appl. No.: 09/940,400

(22) Filed: Aug. 27, 2001

(65) Prior Publication Data

US 2002/0010690 A1 Jan. 24, 2002

Related U.S. Application Data

(63) Continuation of application No. 09/027,545, filed on Feb. 23, 1998, now abandoned.

(51) Int. Cl.$^7$ ................................................. H02B 1/03
(52) U.S. Cl. ........................ 702/62; 702/64; 340/870.02
(58) Field of Search ................................. 702/57, 60–62, 702/64, 65, 122, 124, 126, 182, 183, 188, 189, 187, 198, FOR 103, FOR 104, FOR 106, FOR 111, FOR 112, FOR 134, FOR 170, FOR 171; 324/140 R, 141, 142, 116; 700/286, 291, 292, 295–298; 340/870.01–870.03, 870.05, 870.06, 870.12, 870.13, 870.21; 705/412; 379/106.03, 106.06, 106.07, 106.08; 307/38, 39, 41, 112, 113, 125, 126, 130, 131

(56) References Cited

U.S. PATENT DOCUMENTS

| | | | |
|---|---|---|---|
| 4,591,988 A | | 5/1986 | Klima et al. ................ 705/412 |
| 4,675,828 A | | 6/1987 | Winston ..................... 700/286 |
| 4,804,957 A | | 2/1989 | Selph et al. ........... 340/870.03 |
| 5,053,766 A | | 10/1991 | Ruiz-del-Portal et al. ........... 340/870.02 |
| 5,315,531 A | * | 5/1994 | Oravetz et al. ............. 324/142 |
| 5,404,136 A | | 4/1995 | Marsden ................ 340/870.03 |
| 5,491,473 A | | 2/1996 | Gilbert .................. 340/870.01 |
| 5,572,438 A | * | 11/1996 | Ehlers et al. ................. 307/37 |
| 5,861,683 A | * | 1/1999 | Engel et al. ................ 307/147 |
| 5,963,146 A | * | 10/1999 | Johnson et al. ........ 340/825.02 |
| 5,995,911 A | * | 11/1999 | Hart .......................... 324/126 |
| 6,088,659 A | * | 7/2000 | Kelley et al. .......... 340/870.02 |

OTHER PUBLICATIONS

Microsoft Press Computer Dictionary, 1994, Microsoft Press, Second Edition, p. 416.*

* cited by examiner

*Primary Examiner*—Hal Wachsman
(74) *Attorney, Agent, or Firm*—Irah H. Donner; Hale and Dorr LLP

(57) ABSTRACT

An energy information system and sub-measurement board for use therewith allows and energy information service provider to measure energy usage at a customer location. The sub-measurement board is connected to an energy distribution panel located at the customer location and measures energy usage of individual circuits of the distribution panel. The sub-measurement board outputs a load profile of the energy usage and transmits the load profile to the energy information service provider via a wide area network (WAN). The load profile is processed by the energy service provider and posted on a server for access by the customer. Voltages and currents are input into a microprocessor circuit, which compares the currents one at a time to the voltages to match the current with the voltage of the same individual circuit and to calculate the load profile of the individual circuit.

17 Claims, 11 Drawing Sheets

ENERGY INFORMATION SYSTEM AND SUB-MEASUREMENT BOARD FOR USE THEREWITH

CROSS-REFERENCE TO RELATED APPLICATIONS

This application is a continuation of application Ser. No. 09/027,545, filed Feb. 23, 1998, for Energy Information System And Sub-Measurement Board For Use Therewith, which has since been abandoned.

BACKGROUND OF THE INVENTION

1. Technical Field

Generally, the invention relates to a communications enabled-energy information system and sub-measurement board for use therewith. Particularly, the invention relates to an energy information system having a sub-measurement board which measures power consumption of individual circuits of a customer's distribution load panel and which is capable of providing cumulative periodic consumption data of the customer's other metered utilities. Specifically, the invention relates to an energy information system which transmits load profile data of individual electric circuits back to the energy information service provider for processing into a format which is accessible by the energy information service provider for internal use and accessible by the customer for monitoring energy usage of specific circuit loads such as heating, air-conditioning, lighting, etc, and which can provide the customer with cumulative periodic consumption data of all the customer's metered utilities such as electric, gas and water.

2. Background Information

Typically utility companies send their customers a single invoice for total utility usage for a monthly period. However, customers may wish to receive more detailed utility data which would allow the customer to monitor specific circuits or areas of utility consumption. By providing a more detailed utility usage report, the energy information service provider can assist the customer in more fully understanding the customer's energy consumption patterns and ways to change these patterns to reduce utility usage and the monthly costs thereof.

If the customer has access to energy consumption information for specific circuits, such as the circuit providing energy to heating, air-conditioning, lighting, etc., the customer can work with the energy information service provider in analyzing this usage data. For example, by analyzing this consumption data, the customer may discover that a particular piece of equipment is inefficient and using an excessive amount of energy. The customer may wish to replace that equipment with a newer, more energy efficient unit. Also, the customer may discover that the energy consumption of other equipment could be minimized to reduce the number of hours the equipment runs thus decreasing energy consumption by the equipment and the energy costs thereof.

Additionally, if the customer can monitor the cumulative usage of all of his or her utilities for a given period, the customer may discover that he or she is using an excessive amount of water, gas or electric during a given month. The customer can look at this cumulative periodic consumption data and make an effort to reduce the usage for the remainder of the month to prevent the water, gas or electric bill from being too high.

Several sub-metering boards have been developed which monitor energy usage of specific circuits. For example, U.S. Pat. No. 4,591,988 discloses an energy cost allocation method and system which receives information from individual apartments and forwards the information to a main computer. The main computer provides an output display which displays the individual power usage or requirement. The computer is attached to a phone line which transmits the information to a central computer for billing purposes.

U.S. Pat. No. 4,675,828 discloses an energy cost allocation system for allocating energy use among a plurality of heat exchange terminals. A single system provides a cyclic polling of each monitor unit at a corresponding unique address with each monitor providing to the control a signal indicative of the operation of the driving unit. The control calculates the energy cost per unit time for each monitored unit based on the operating time and speed of each motor.

U.S. Pat. No. 4,804,957 discloses a utility meter and submetering system which provides multiple meters multiplexed through a data collection computer which, in turn, is networked with other data collection computers to a central billing computer.

U.S. Pat. No. 5,404,136 discloses a method and apparatus for monitoring the consumption of utilities in business premises. A central computer receives consumption data from individual notional zones, each of which includes a utility load and a meter to record consumption within the zone. The computer calculates the total utility consumption with the zones of a group and supplies control data to the zones for controlling utility consumption. A single loss monitoring device records the total losses which occur between a point and the utility loads and the zones. The loss monitoring device transfers this information to the computer.

U.S. Pat. No. 5,491,473 discloses a system for remote data collecting, method implemented in this system and data collector device. The remote data collection relates specifically to energy consumption for supply sites and demand sites management. The device provides a plurality of local collection sites as well as a data acquisition site positioned adjacent to each data collection sites. Data acquisitions sites are attached to one another via a local network and each local network is then connected to a central site via a second wide area network. The central collection site compromises central monitoring and processing devices for retrieving and transmitting data.

Although these devices and methods are adequate for the purposes for which they are intended, these inventions do not disclose an energy information system and sub-measurement board for use therewith which monitors and provides information about individual circuits of a customer's distribution load panel and which is capable of providing cumulative periodic consumption data of all of the customer's metered utilities.

Therefore, the need exists for an energy information system and sub-measurement board for use therewith which measures individual circuits of a customer's distribution load panel, which transmits this load profile data back to the energy information service provider, which provides this information to the customer in an easily accessible and readable format, and which also provides cumulative periodic consumption data for all of the customer's metered utilities.

SUMMARY OF THE INVENTION

Objectives of the present invention include providing an energy information system and sub-measurement board for use therewith which provides accurate energy consumption information for pro-active energy management.

A further objective is to provide a system and sub-measurement board which measures individual utility loads and posts this load profile data for access by the customer.

Another objective is to provide a system and sub-measurement board which provides this load profile data to the customer in a format which is easy to read and analyze.

A still further objective is to provide a system and sub-measurement board in which the sub-measurement board resides at the customer's location and which transmits the load profile data back to a server or website for processing and posting thereby.

A further objective is to provide a system and sub-measurement board which utilizes circuitry and software to measure the load profile data, transmit the load profile data to the energy information service provider and post the data on a server or other type of communication device for access by the customer.

Another objective is to provide a system and sub-measurement board in which the load profile data transmitted can be used by the energy information service provider for engineering, billing, customer information systems, marketing, etc.

A further objective is to provide a system and sub-measurement board which is capable of providing cumulative periodic usage of all of the customer's metered utilities.

Another objective is to provide a system and sub-measurement board which matches a current signal with a voltage signal of the same circuit to calculate accurate energy consumption.

A still further objective is to provide a system and sub-measurement board of simple construction, which achieves the stated objectives in a simple, effective and inexpensive manner, which solves problems and satisfies needs existing in the art.

These objectives and advantages are achieved by the energy information system and sub-measurement board for use therewith, the general nature of which may be stated as including a sub-measurement board which receives voltage and current signals representative of energy usage at the discrete location, said sub-measurement board outputs a load profile of said energy usage; a first communications network which transfers the load profile to the energy information service provider; a processor located at the energy information service provider which processes the load profile; and a second communications network which provides the customer access to the processed load profile for remote viewing of the load profile by the customer.

These objectives and advantages are further achieved by the method of the present invention, the general nature of which may be stated as including the steps of inputting a voltage signal from one of a plurality of the individual circuits of the distribution panel into a sub-measurement board; inputting a current signal from one of the plurality of individual circuits of the distribution panel into the sub-measurement board; comparing the voltage signal to the current signal to determine whether the voltage signal is connected to the same individual circuit of the distribution panel as the current signal; and calculating the energy information of the individual circuit of the distribution panel when the individual circuit of the voltage signal matches the individual circuit of the current signal.

These objectives and advantages are further achieved by the sub-measurement board of the present invention, the general nature of which may be stated as including a voltage amplifying circuit connected to a voltage terminal of the distribution panel for receiving an input voltage signal, said voltage amplifying circuit amplifies the input voltage signal and outputs an amplified voltage signal; a current amplifying circuit connected to a current terminal of the distribution panel for receiving an input current signal, said current amplifying circuit amplifies the input current signal and outputs an amplified current signal; a switching circuit connected to the current amplifying circuit for receiving the amplified current signal, said switching circuit outputs a switched amplified current signal; an analog-to-digital converter connected to the voltage amplifying circuit and the switching circuit for converting the amplified voltage signal into a digital voltage signal and for converting the switched amplified current signal to a digital current signal; a microprocessor connected to the analog-to-digital converter for receiving the digital voltage signal and the digital current signal, said microprocessor calculates the load data of individual circuits of the energy distribution panel; and an output device for outputting the calculated load data of the individual circuits of the energy distribution panel.

BRIEF DESCRIPTION OF THE DRAWINGS

A preferred embodiment of the invention, illustrative of the best mode in which Applicants have contemplated applying the principals, is set forth in the following description and is shown in the drawings and is particularly and distinctly pointed out and set forth in the appended claims.

Similar numbers refer to similar parts throughout the drawings.

DESCRIPTION OF THE PREFERRED EMBODIMENTS

Figure 2:
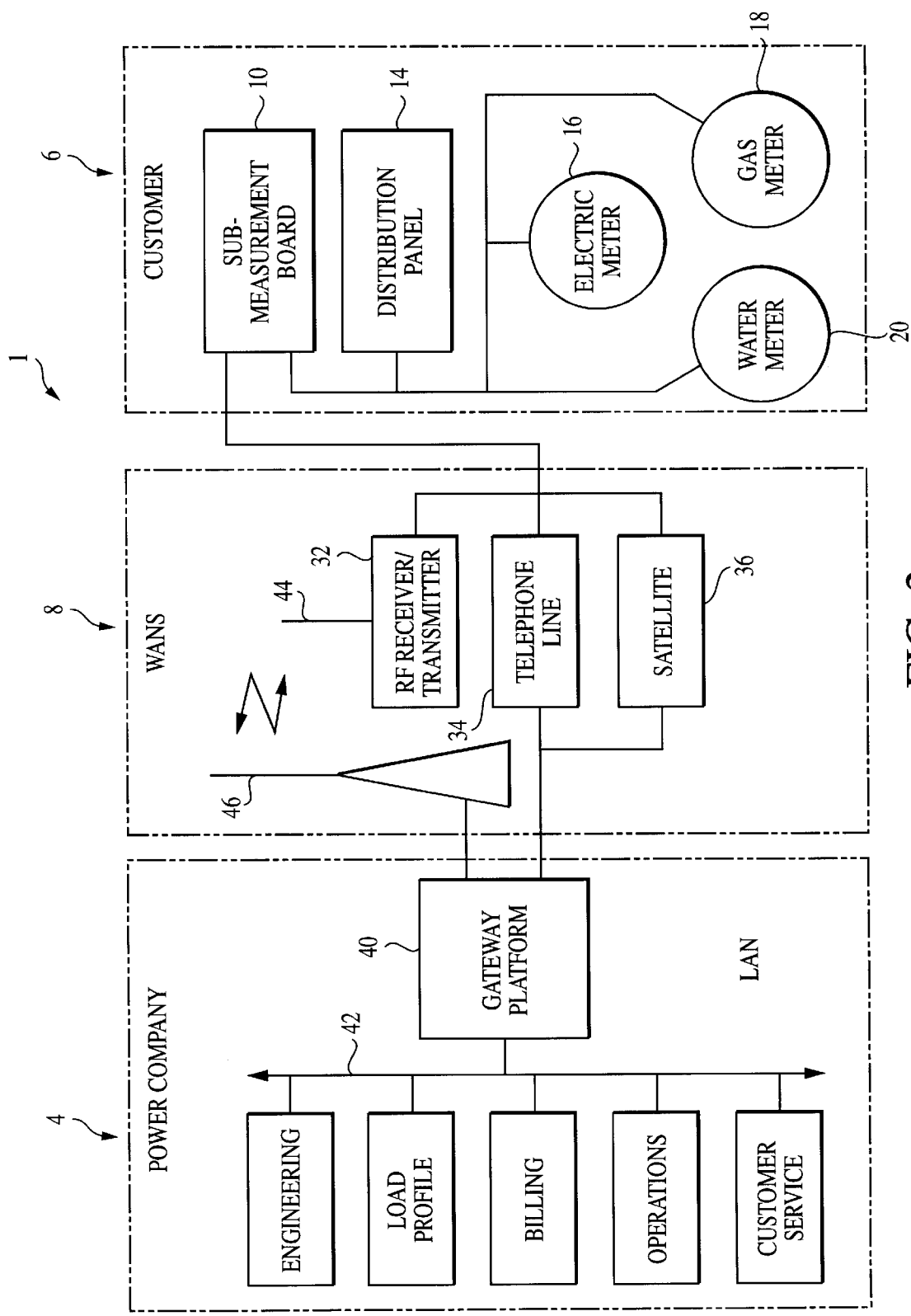
FIG. 2 is a block diagram of the energy information system and sub-measurement board for use therewith of the present invention.

The energy information system of the present invention is shown in FIG. 2 and is indicated at 1. Energy information system 1 allows an energy information service provider 4 to measure power consumption of individual circuits at a customer location 6 and transmit this data back to power company 4 via a wide area network (WAN) 8. A sub-measurement board 10 resides at customer location 6 and is connected to the customer's electric distribution panel 14, as well as the customer's various utility meters, such as an electric meter 16, a gas meter 18 and a water meter 20. Sub-measurement board 10 is used to measure the individual electric circuits within distribution panel 14 and provide energy information service provider 4 with a load profile of the measured energy consumption data. The load profile data includes such measurements as volts, amperes, watts, VARS or any other electrical measurement data which may be useful in determining power consumption. Sub-measurement board 10 is also connected to electric meter 16, gas meter 18 and water meter 20 and receives electric pulses therefrom. Sub-measurement board 10 processes this information and provides the customer with a cumulative real-time measurement of the usage of the respective utilities.

In accordance with one of the features of the invention, the load profile data measured by sub-measurement board 10 is transmitted between energy information service provider 4 and customer location 6 by WAN 8. WAN 8 provides two-way communication between energy information service provider 4 and customer location 6 and may include such media as an RF transmitter/receiver 32, a telephone or fiber optic line 34 or satellite network 36. WAN 8 supplies the load profile data to a gateway platform 40 located at power company 4. Gateway platform 40 functions as an interactive server which hosts the software and databases needed to translate the load profile data into a readable and usable format. The load profile data may be output by gateway platform 40 in the form of text reports, charts and graphs which the customer may access using WAN 8.

Sub-measurement board 10 supplies the load profile data to any or all of WAN's 8 for transmission of the load profile data to energy information service provider 4. RF transmitter/receiver 32 receives the load profile data from sub-measurement board 10, converts the data to a digital format and sends the data to an antenna 44. The data is received by another antenna 46 which transfers the data to gateway platform 40.

Alternatively, sub-measurement board 10 may transmit the load profile data to a modem which utilizes existing telephone lines 34 to supply the load profile data to gateway platform 40. The data is received and processed by gateway platform 40 and is available for the customer to access using a personal computer either through a direct dial number or the internet.

Further, sub-measurement board 10 may transmit the load profile data using satellite network 36. An interface box (not shown) processes the data and transmits the processed data to a satellite. An intermediate satellite provider receives the load profile data from the satellite, processes the data and supplies the data to gateway platform 40. Gateway platform 40 processes or massages the data into a readable format and provides this data to LAN 42 as well as posting the information for access by the customer.

This processed load profile data is available to the customer in text, charts or graph format and may be accessed by the customer through a password protected internet server. In addition to providing the information through the internet, the customer may utilize any of WAN's 8. For example, the processed load profile data may be transmitted by antenna 46 back to antenna 44 and RF transmitter/receiver 32 in an encrypted format allowing the customer to access the information using a personal computer and decoding program. Further, the customer may utilize satellite network 36 in a manner similar but opposite to that described above to download and analyze the load profile data.

Figure 3:
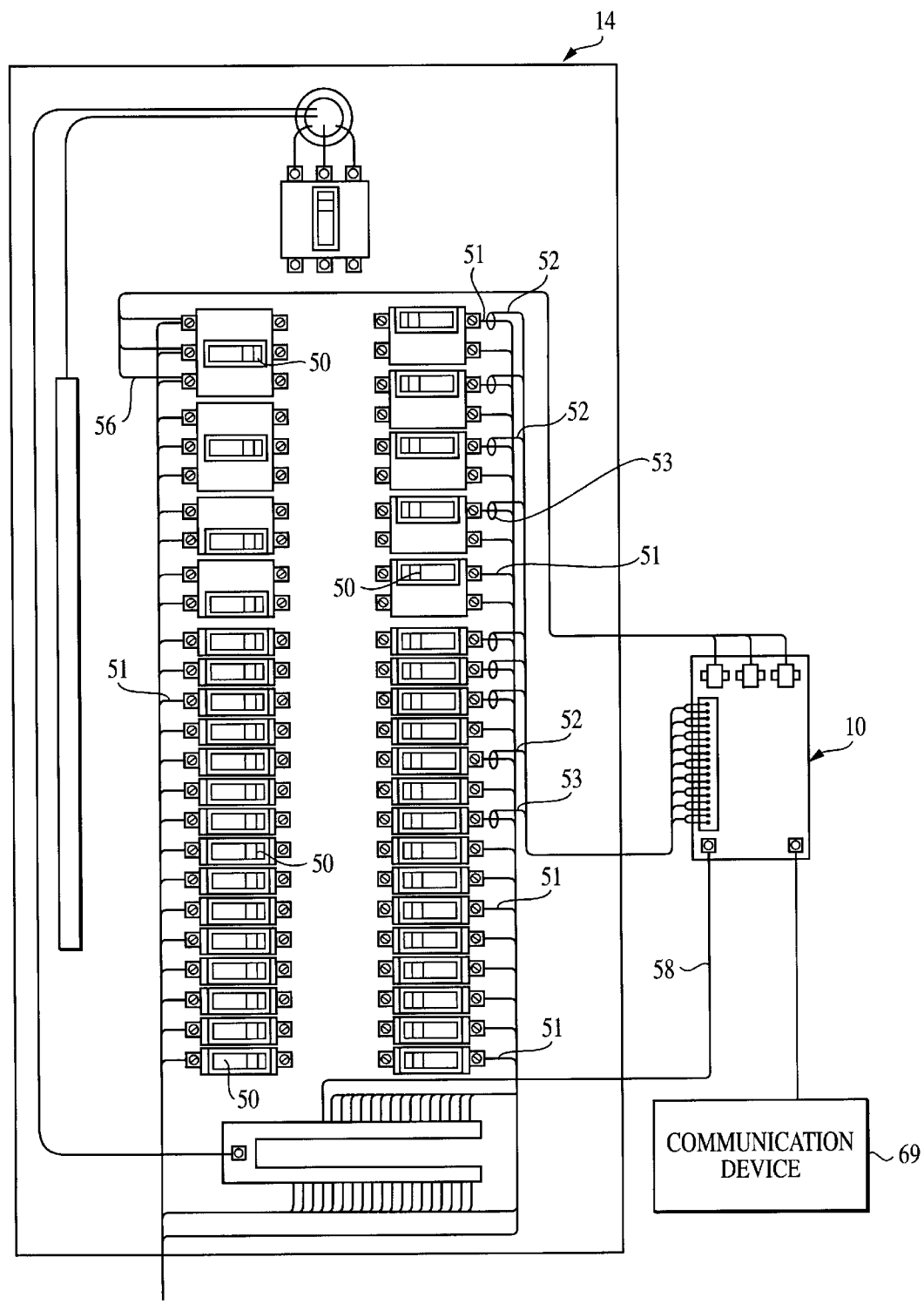
FIG. 3 is a diagrammatic elevational view of a three phase distribution panel with the sub-measurement board connected thereto.

In accordance with another of the features of the invention, sub-measurement board 10 is shown in FIG. 3 attached to distribution panel 14. Distribution panel 14 includes a plurality of circuit breakers 50 which distribute the electricity from power company 4 to various individual circuits 51 of customer location 6. As described above, sub-measurement board 10 allows the customer and energy information service provider 4 to monitor energy consumption by certain of individual circuits 51. The customer may choose to monitor any of individual circuits 51 based on the particular area of location 6 or on a particular piece of equipment or device, such as heating, air-conditioning, lighting, etc.

Figure 1:
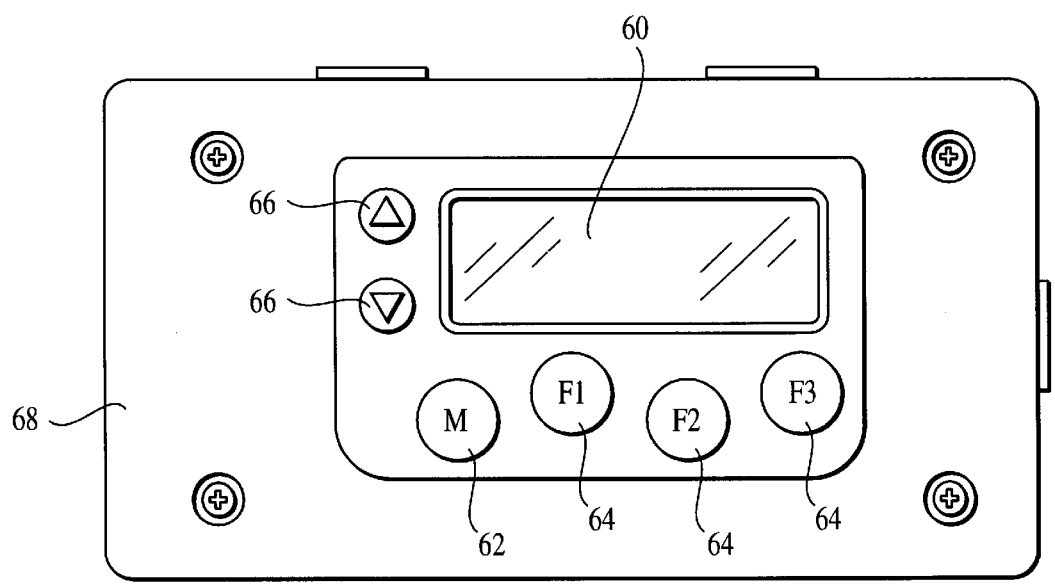
FIG. 1 is a front elevational view of the sub-measurement board of the present invention.
Figure 5:
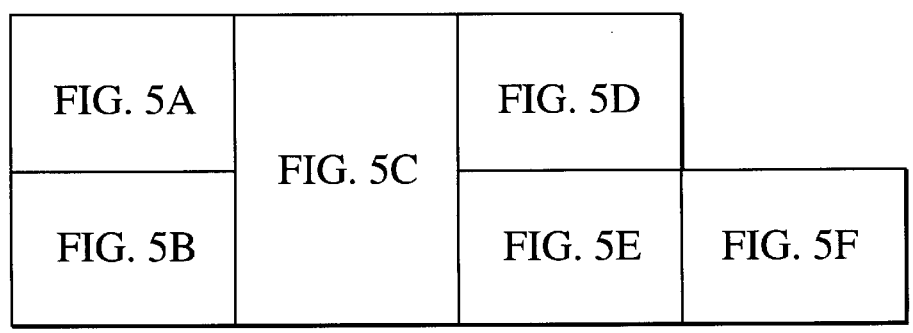
FIG. 5 is a block diagram showing the interconnection of FIGS. 5A–5F.

In the preferred embodiment, sub-measurement board 10 is capable of measuring up to nine single-phase currents 52 and three 3-phase voltages 56. In addition to the nine single-phase currents 52 and three 3-phase voltages 56, sub-measurement board 10 is shown in FIG. 3 connected to the electric, gas and water meters by a line 58 which receives the electric pulses from the meters for measurement of the cumulative utility consumption from each respective meter. This instantaneous total billing load data from the electric, gas and water meters may be directly accessed by the customer on a LCD display 60 (FIG. 1). The customer may use a mode key 62, function keys 64 or selection keys 66 to select and display various usage information, such as the billing load data. Sub-measurement board 10 is enclosed within a plastic covering 68 and is mounted adjacent to and outside of distribution panel 14. A communication device 69, such as a modem, is connected to sub-measurement board 10 for supplying the load profile data to WAN 8.

Figure 4:
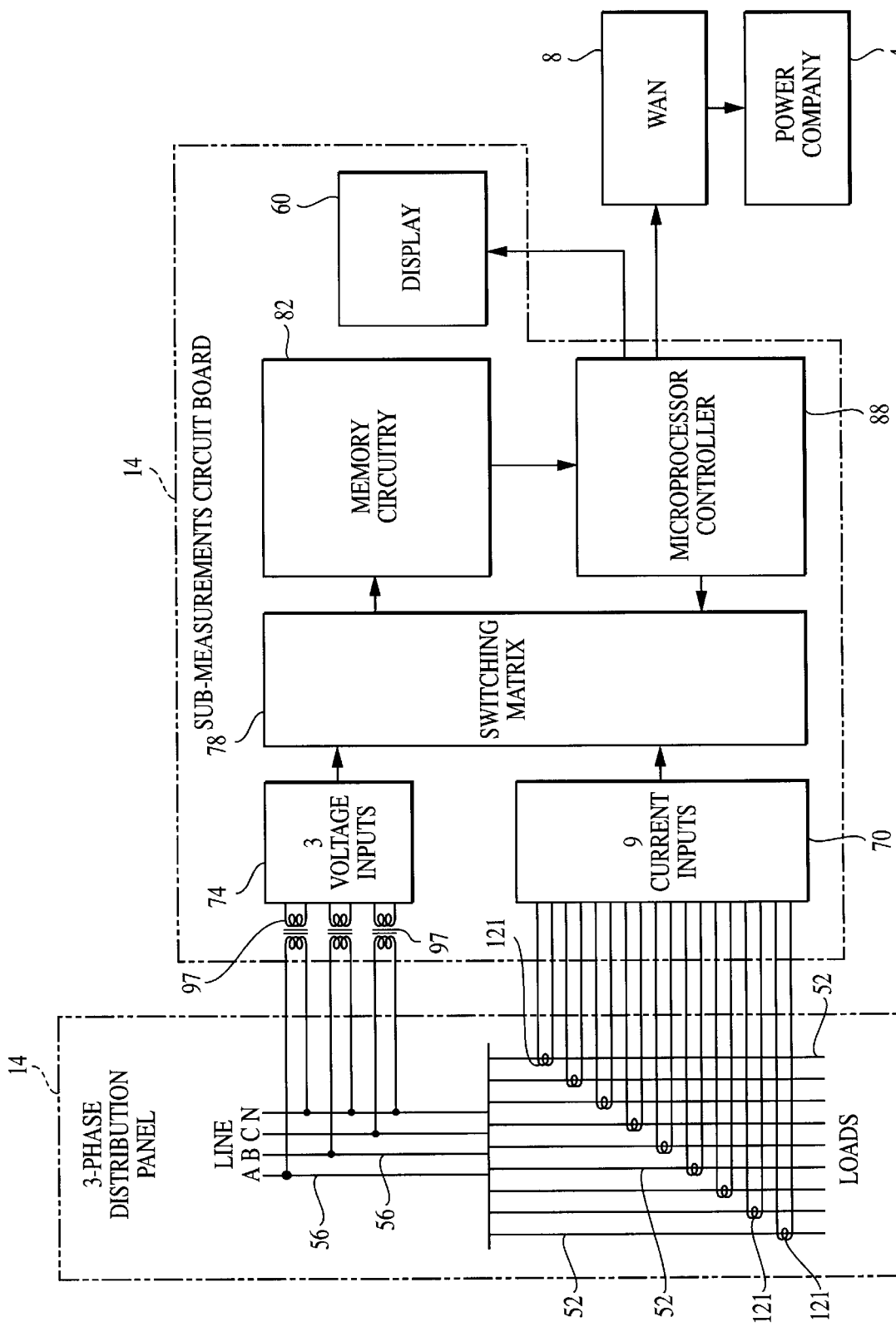
FIG. 4 is block diagram of the sub-measurement circuit board shown attached to three 3-phase voltages and nine single-phase currents of the distribution panel.

The circuitry included within sub-measurement board 10 is shown in FIG. 4 and generally includes current input amplifier circuitry 70 and voltage input amplifier circuitry 74 which output current and voltage signals, respectively, to a switching matrix circuit 78. Switching matrix circuitry 78 outputs an analog data signal to an A/D converter. The voltage signals from voltage input amplifier circuitry 74 are applied directly to the analog inputs of the A/D converter. A memory circuit 82 is connected to a microprocessor controller or central processing unit (CPU) 88 which processes the data stored from memory circuitry 82 and outputs the load profile load data to LCD display 60 and WAN 8 for transfer to power company 4. Microprocessor 88 is also connected back to switching matrix circuitry 78 for controlling which of currents 52 and voltages 56 are output to memory circuitry 82.

Figure 5A:
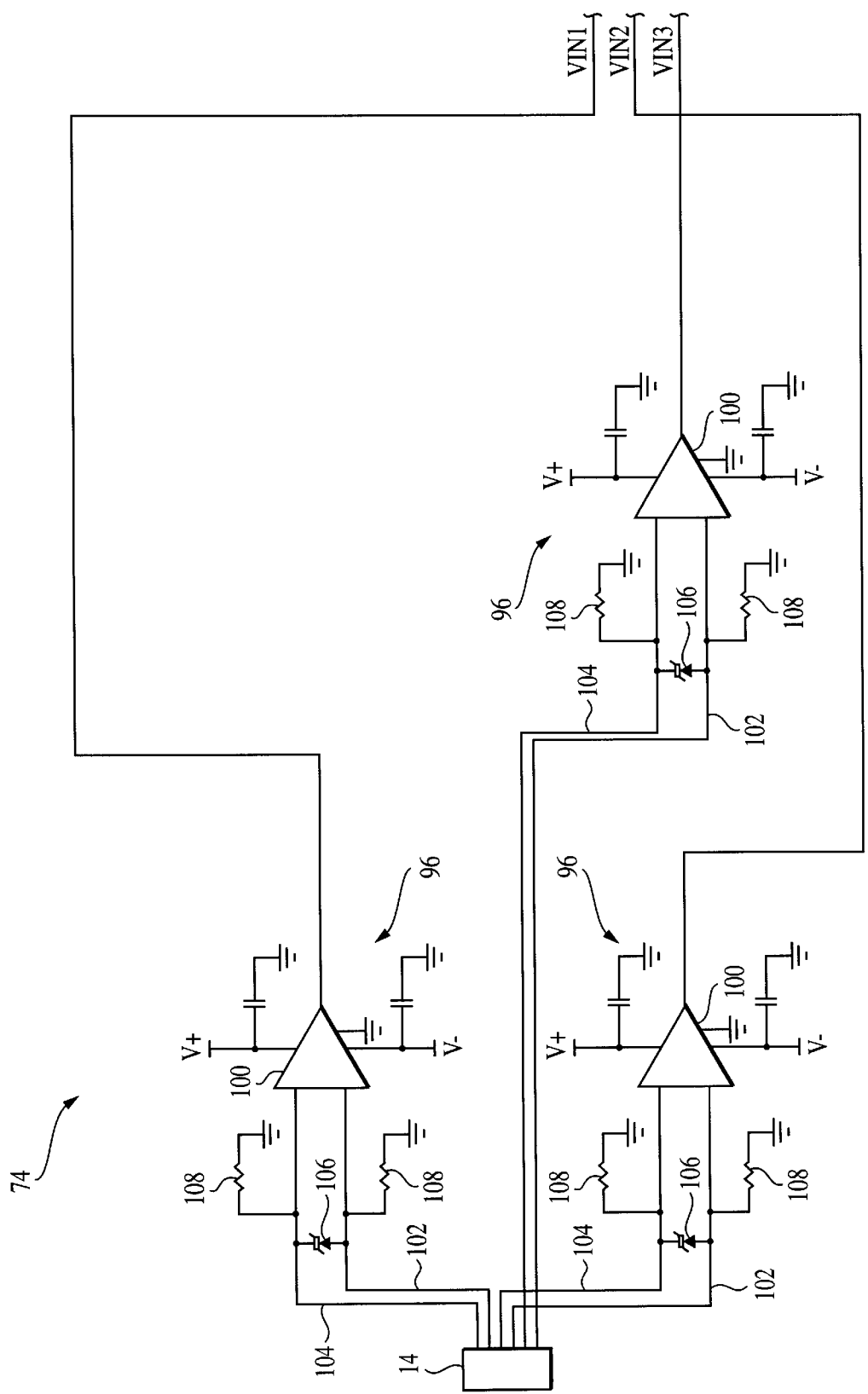
FIG. 5A is schematic diagram showing the three 3-phase voltages being input into respective voltage input amplifier circuits.

Voltage input amplifier circuitry 74 includes three voltage amplifier circuits 96 (FIG. 5A) which receive an input voltage signal from a respective voltage transformer 97. Each voltage amplifier circuit 96 includes an instrumentation amplifier 100 which receives a positive input 102 and a negative input 104 from one of three-phase circuits 56. Positive and negative inputs 102 and 104, respectively, are interconnected by a zener diode 106. A resistor 108 extends between positive input 102 and ground, and negative input 104 and ground and is connected to each input line 102 and 104 between instrumentation amplifier 100 and zener diode 106. Instrumentation amplifiers 100 are powered by a positive supply voltage V+ and a negative supply voltage V−. A capacitor 110 extends between each supply voltage V+ and V− and ground. Voltage amplifier circuits 96 output voltage signals VIN1–VIN3 to switching matrix circuitry 78.

Figure 5B:
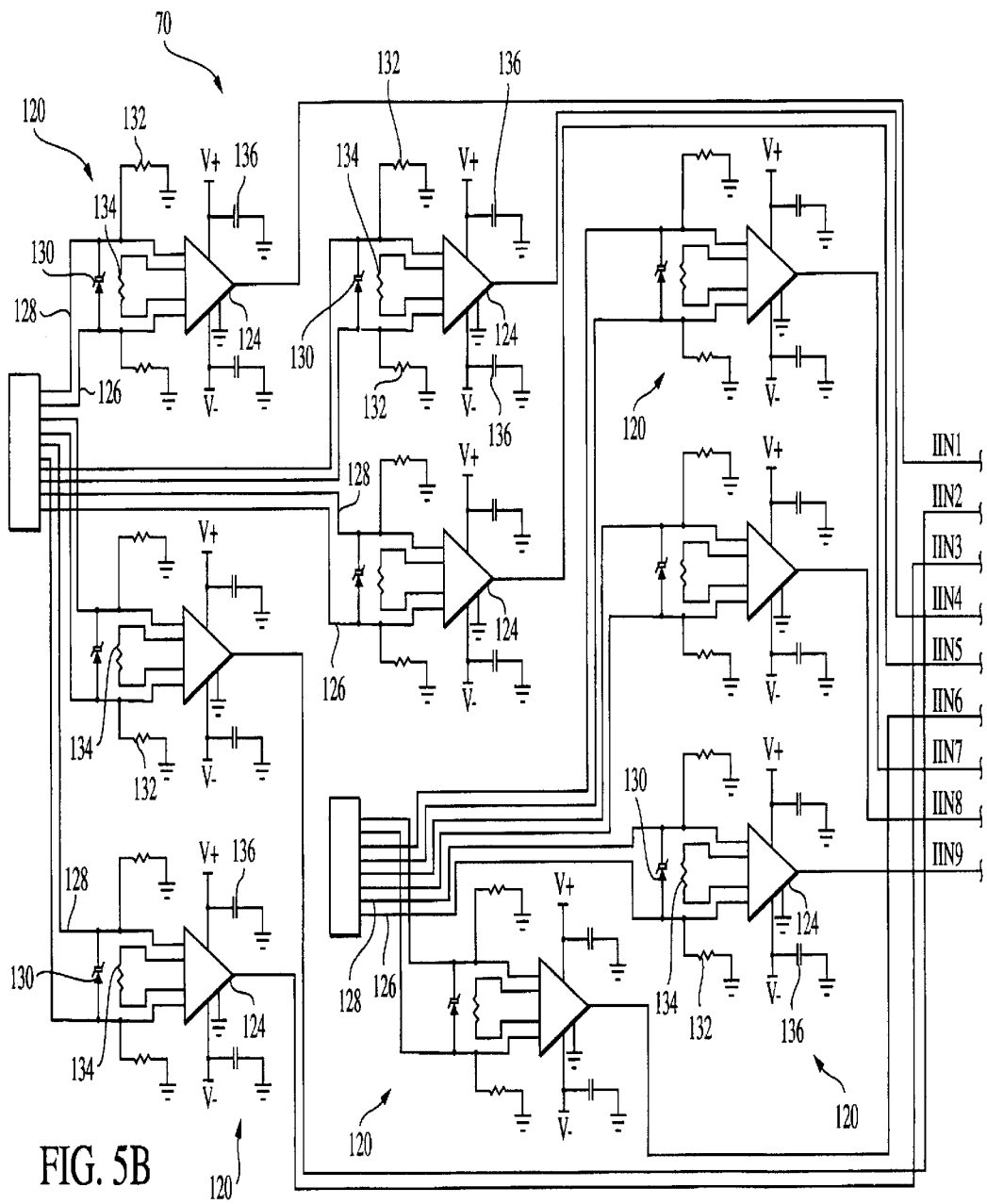
FIG. 5B is a schematic diagram showing the nine single-phase currents being input into respective current amplifier circuits.
Figure 5C:
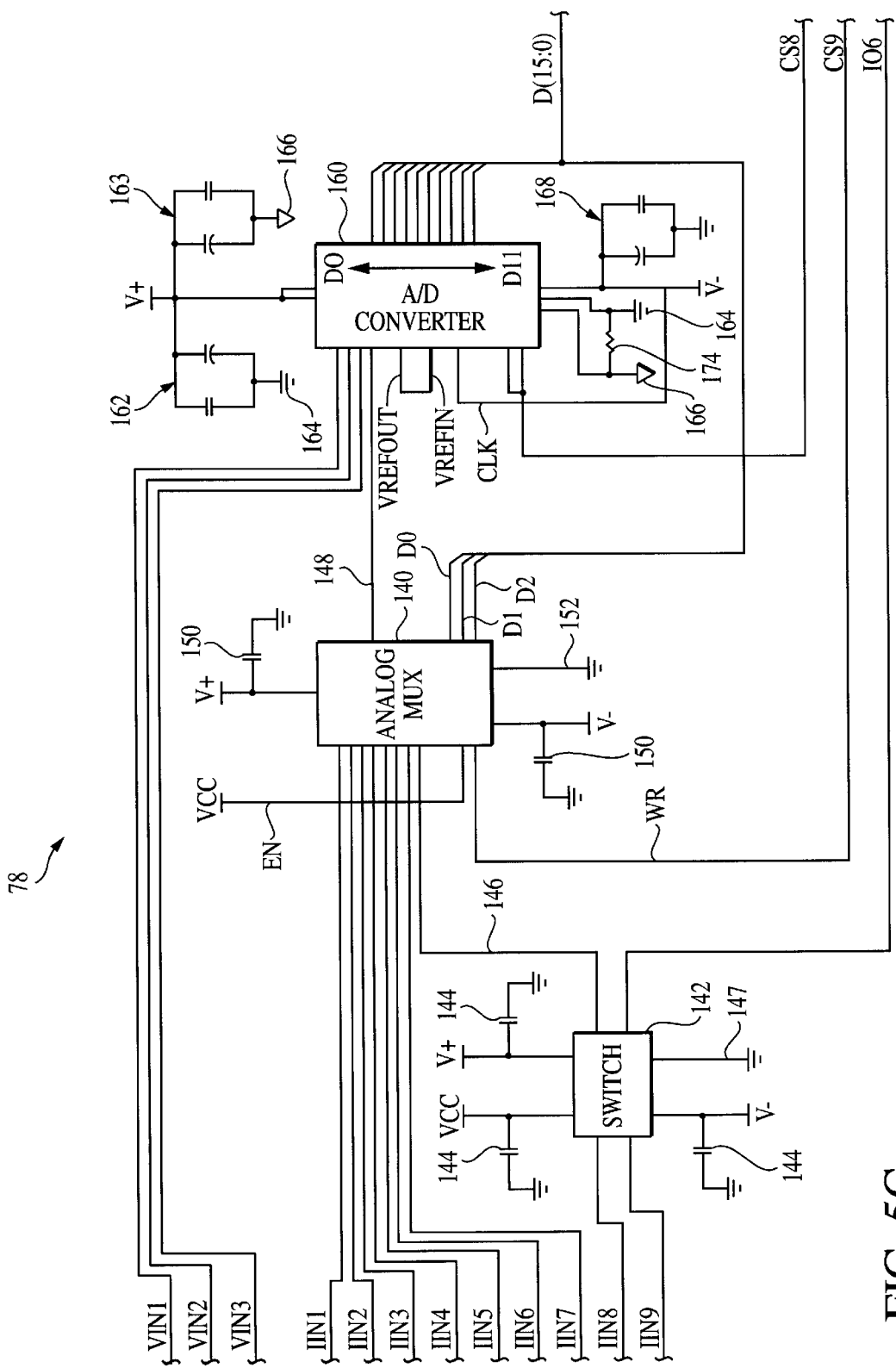
FIG. 5C is a schematic diagram showing the signals output from the circuits of FIGS. 5A and 5B being input into analog multiplexer and analog-to-digital converter circuitry.
Figure 5D:
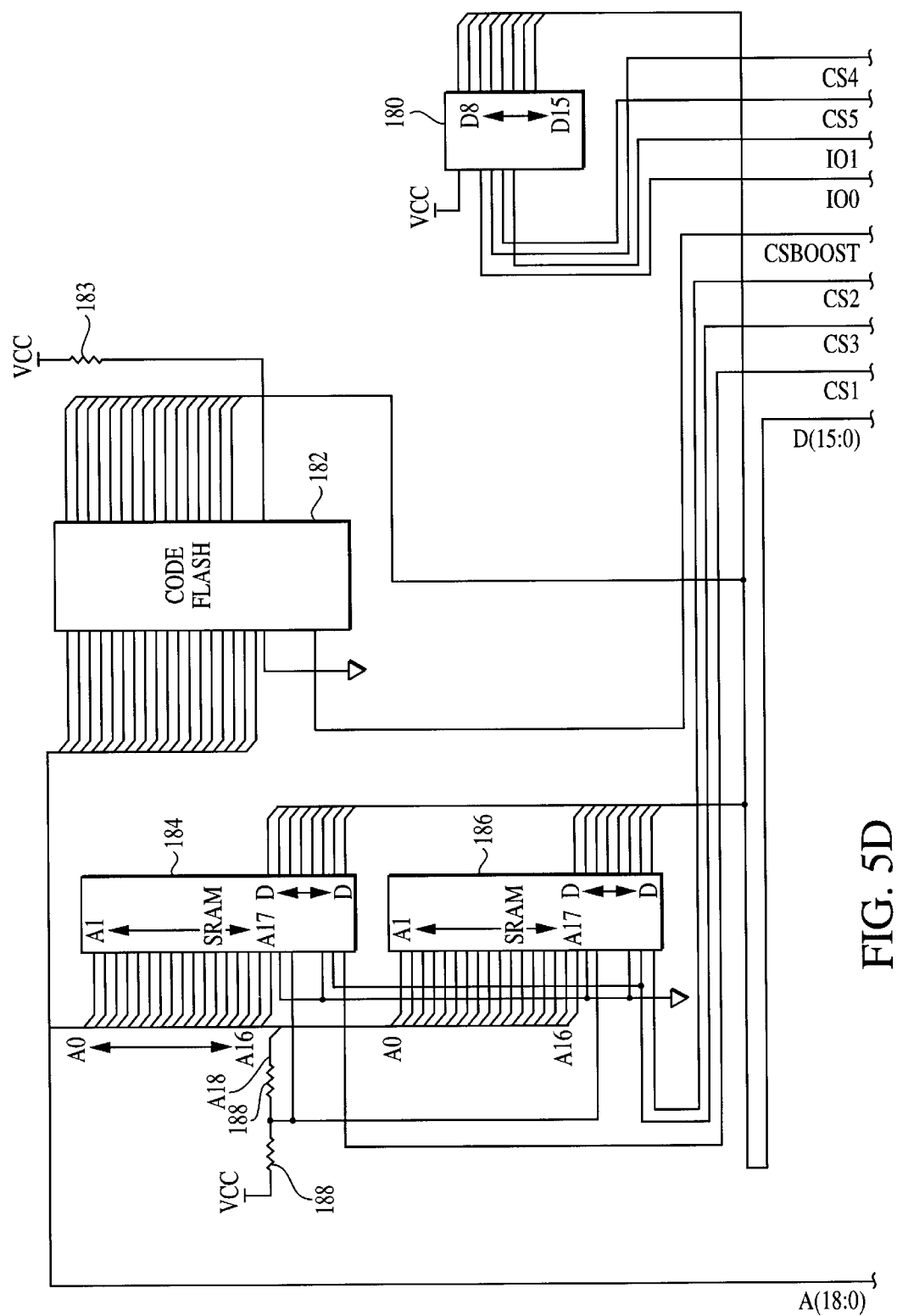
FIG. 5D is a schematic diagram showing code flash, SRAM and real time clock circuitry.

Current input amplifier circuitry 70 includes nine input amplifier circuits 120 (FIG. 5B) which receive a representative current signal from the secondary winding of a respective current transformer 121. Each current amplifier circuit 120 includes an instrumentation amplifier 124 which receives a positive input 126 and a negative input 128 from one of the nine single-phase circuits 52. Positive and negative inputs 126 and 128, respectively, are interconnected by a zener diode 130. A resistor 132 extends between positive input 126 and ground, and negative input 128 and ground and is connected to each input line 126 and 128 between operational amplifier 124 and zener diode 130. Another resistor 134 extends between the RG1 and RG2 inputs of operational amplifier 124. Operational amplifiers 124 are powered by a positive supply voltage V+ and a negative supply voltage V−. A capacitor 136 extends between each supply voltage V+ and V− and ground. Current amplifier circuits 120 output current signals IIN1–IIN9 to switching matrix circuitry 78.

In the preferred embodiment, amplifiers 100 and 124 are low cost, high accuracy instrumentation amplifiers, such as model AD620 manufactured by Analog Devices of Norwood, Mass. The gain of op amps 124 is determined by the valuation of resistor 134 which in the preferred embodiment is equal to 5.49 kΩ, thus producing a gain in current amplifiers circuits 120 of 9.998.

Voltage amplifier circuits 96 and current amplifier circuits 120 output a signal VIN1–VIN3 and IIN1–IIN9, respectively, to switching matrix circuit 78. Switching matrix circuit 78 includes a monolithic analog multiplexer 140, a monolithic CMOS STDT switch 142 and a 4-channel simultaneous sampling, 12-bit data acquisition system or analog-to-digital (A/D) converter 160. Because multiplexer 140 includes only eight input terminals, signals IIN8 and IIN9 are input into switch 142 which switches between and outputs one of the two signals to multiplexer 140. Switch 142 includes a positive supply voltage V+, a negative supply voltage V− and a logic supply voltage VCC. A capacitor 144 extends between each supply voltage and ground. An input/output line IO6 is connected to a logic control terminal of switch 142 and connects switch 142 to microprocessor 88. Switch 142 has a drain terminal 146 which functions as an output to analog multiplexer 140. Switch 142 is grounded at 147.

Analog multiplexer 140 includes eight input channels which are connected to output signals IIN1–IIN7 of current amplifier circuits 120 and output terminal 146 of switch 142. Multiplexer 140 switches one of these eight inputs to a common output 148 depending on the state of 3 binary addresses D0, D1 and D2, and an enable input EN which is connected to logic supply voltage VCC. A data line CS9 extends between a write terminal WR of multiplexer 140 and microprocessor 88. A most positive supply voltage V+ and a most negative supply voltage V− are connected to multiplexer 140 with a capacitor 150 connected between the supply voltages and ground. Multiplexer 140 is grounded at line 152.

A/D converter 160 receives output signals VIN1–VIN3 from voltage amplifier circuits 96 along with output 148 of multiplexer 140, and outputs a 12-bit digital signal (D0–D11) to a 16-bit digital data line D(15:0). A/D converter 160 requires two positive supply voltage inputs which are tied together and connected to a positive voltage V+. A pair of capacitive circuits 162 and 163 are connected between positive supply voltage V+ and A/D converter 160 with capacitive circuit 162 connected to an analog ground 164 and capacitive circuit 163 connected to a digital ground 166. A/D/converter 160 further requires a negative supply voltage V− which includes a capacitive circuit 168 similar to capacitive circuit 162 and also connected to analog ground 164. Negative supply voltage V− is connected to the clock input CLK of A/D converter 160 to enable an internal laser trimmed clock oscillator. A voltage reference input VREFIN and a voltage reference output VREFOUT of converter 160 are connected to one another allowing converter 160 to operate with internal reference. The analog and digital ground terminals of A/D converter 160 are connected to analog ground 164 and digital ground 166, respectively, with a resistor 174 extending therebetween. A chip select terminal and a read terminal of A/D converter 160 are tied together and connected to microprocessor 88 by a chip select line CS8.

Memory circuitry 82 is connected to microprocessor 88 by 16-bit data line D(15:0) and includes a real time clock 180, a code flash or erase/memory chip 182 and a pair of static random access memory chips (SRAM) 184 and 186. Real time clock 180 functions as an internal computer clock/calendar and has an embedded lithium battery and quartz crystal which maintain the real time clock data in the absence of power. Clock 180 includes a multiplexed address/bus which connects to bits D8–D15 of 16-bit data line D(15:0). Clock 180 further includes a chip select terminal connected to microprocessor 88 by line 100, an address strobe terminal line connected to microprocessor 88 by line CS4, a data strobe terminal connected to microprocessor 88 by line CS5, and a read/write input terminal connected to microprocessor 88 by line IO1. Clock 180 is powered by positive supply voltage VCC.

Flash/memory chip 182 is a programmable memory chip which retains its programming when power to the chip has been terminated and which may be reprogrammed by a standard external programmer. Flash/memory chip 182 is connected to microprocessor 88 by 16-bit data line D(15:0) and by a 19-bit address line A(18:0) and supplies both stored voltage and current information as well as programmed instructions to the microprocessor. Addresses A1–A18 of 19-bit address line A(18:0) are connected to the input address terminals A0–A17 of flash/memory chip 182 with address terminal A18 of the chip connected to digital ground 166. A chip enable input terminal of flash/memory chip 182 is connected to microprocessor 88 via a CSBOOT line. Memory chip 182 is powered by positive supply voltage VCC with a resistor 183 connected between the supply voltage and chip 182. Memory chip 182 stores the voltage and current information for which is used by microprocessor 88 to calculate the load profile data.

SRAM chips 184 and 186 receive addresses A1–A17 of address line A(18:0) into address input terminals A0–A16 thereof. SRAM 184 receives data bits D0–D7 of 16-bit data line D(15:0) into data input/output terminals D1–D8 thereof. SRAM chip 186 receives data bits D8–D15 of 16-bit line D(15:0) into data input/output terminals D1–D8 thereof. Chip select 1 of each SRAM chip 184 and 186 is attached to digital ground 166 while chip select 2 of each SRAM chip 184 and 186 is connected to positive supply voltage VCC. An output enable terminal of each SRAM chip is connected to microprocessor 88 by chip select line CS3. A write enable terminal of SRAM chips 184 and 186 is connected to microprocessor 88 by chip select lines CS1 and CS2, respectively. Address bit A18 of address line A(18:0) is connected to positive supply voltage VCC with two resistors 188 extending therebetween. The connection of chip select 2 of SRAM chips 184 and 186 is taken from supply voltage VCC between resistors 188.

In the preferred embodiment, microprocessor 88 is a 32-bit modular micro-controller, such as model MC68332 manufactured by Motorola, Inc. of Schaumburg, Ill. Microprocessor 88 inputs and outputs data onto 16-bit data line D(15:0) and 19-bit address line A(18:0) and outputs a plurality of chip select lines CSBOOT, CS1–CS5 and CS7–CS10. The chip select lines allow microprocessor 88 to control which chips of sub-measurement board 10 write to data line D(15:0) and address line A(18:0) at what time. By controlling the sequence of chip operation using chip select lines CSBOOT, CS1–CS5 and CS7–CS10, the microprocessor can assure that no two chips are writing to the common data and address lines at the same time.

A plurality of timed processor unit terminals TPU3–TPU8 of microprocessor 88 are connected to a keypad connector circuit 190 which allows the customer to access the load profile data and meter data through mode key 62, function keys 64 and selection keys 66. Keypad connector circuit 190 includes a 10 k network resistor bus 192 connected to supply voltage VCC, and a seven pin jumper 194. A bus error terminal BERR, a breakpoint terminal BKPT, a freeze terminal FREEZE, and a pair of instruction pipeline terminals IFETCH and IPIPE are connected to a boot start-up or BDM connector circuit 200. BDM connector circuit 200 includes a 5×2 pin jumper 202 and allows the initial software instructions to be input into microprocessor 88 during the first boot startup thereof. At the first boot-up of microprocessor 88 memory chips 182, 184 and 186 are blank requiring microprocessor 88 to receive its first set of programming instructions via BDM connector circuit 200. Thereafter, microprocessor 88 will receive its instructions from flash/memory chip 182.

Microprocessor 88 further includes a clock circuit 210 which is connected to a pair of crystal oscillator terminals EXTAL and XTAL. Clock circuit 210 includes a 32.768 KHz crystal 212 for supplying microprocessor 88 with a standard reference frequency. A first resistor 214 is connected between the two terminals of crystal 212 and a second resistor 216 is connected between crystal 212 and terminal XTAL of microprocessor 88. A capacitor 218 is connected between each terminal of crystal 212 and digital ground 166. Microprocessor 88 is powered by a circuit 220 which is connected to positive supply voltage VCC. Circuit 220 includes an inductor 222 which is connected between the positive supply voltage VCC and a voltage input terminal VDDSYN of microprocessor 88, an external phase-locked loop filter capacitor 224 which is connected between inductor 222 and a capacitor input terminal XFC of microprocessor 88, and a resistor 226 which is connected between positive supply voltage VCC and an external clock source terminal T2CLK of microprocessor 88.

Microprocessor 88 calculates the load profile data and outputs the data to a display circuit 248, an optically isolated discrete I/O circuit 262, a modem and RS-232 circuit 282. Display circuit 248 includes a 16-bit flip-flop 250 and a 16 pin jumper 252 which connects display circuit 248 to LCD display 60 and the various display drivers (not shown) associated therewith. Flip-flop 250 includes sixteen data input terminals 1D1–1D8 and 2D1–2D8 which are connected to data bits D0–D7 and D8–D15, respectively, of 16-bit data line D(15:0), a pair of output terminals OE1 and OE2 which are connected to digital ground 166, and a pair of clock pulse input terminals CP1 and CP2 which are both connected to microprocessor 88 by a chip select line CS7. Flip-flop 250 further includes sixteen output terminals 1Q1–1Q8, which are connected to pins 4–11 of jumper 252, and 2Q1–2Q8, the first three of which are connected to pins 12–14 of jumper 252. A first pin 1 of jumper 252 is connected to digital ground 166, a second pin 2 of jumper 252 is connected to positive supply voltage VCC, and a third pin 3 of jumper 252 is connected to a potentiometer circuit 254.

Outputs 2Q5–2Q8 of flip-flop 250 are connected to data inputs 2A1–2A4 of an octal line driver/buffer 260 of optically isolated discrete I/O circuit 262. Driver/buffer 260 is connected to microprocessor 88 through a chip select line CS10. Discrete I/O circuit 262 receives the input/output digital pulse data from electric meter 16, gas meter 18 and water meter 20 and supplies this data to microprocessor 88 through bus outputs Y1–Y4, which are connected to bits D8–D11 of 16-bit data line D(15:0). Discrete I/O circuit 262 further includes a pair of high isolation voltage SOP multi-photo couplers 270 and 272. Photo couplers 270 and 272 are optically coupled isolators containing a GaAs light emitting diode and an NPN cyclone photo transistor. Each photo coupler is mounted in a plastic small outline package (SOP) having shield effect to cut off ambient light.

Photo coupler 270 isolates the input of meters 16, 18 and 20 into sub-measurement board 10 and includes four anode terminals A1–A4 which are connected to one side of a 4×2 pin jumper 278. A resistor 276 is connected between each anode terminal A1–A4 and jumper 278. Four cathode terminals K1–K4 of photo coupler 270 are connected to the other side of jumper 278. Photo coupler 270 further includes four collector terminals C1–C4, all of which are connected to positive supply voltage VCC, and four emitter terminals E1–E4 which are connected to data inputs 1A1–1A4 of octal line driver/buffer 260. A resistor 280 is connected between each emitter output of photo coupler 270 and digital ground 166.

Photo coupler 272 isolates the output of sub-measurement board 10 to meters 16, 18 and 20 and is connected within discrete I/O circuit 262 in a manner somewhat opposite of that of photo coupler 270. Collector terminals C1–C4 of photo coupler 272 are connected to one side of another 4×2 pin jumper 279 with the other side of jumper 279 connected to emitter terminals E1–E4 of photo coupler 272. Cathodes terminals K1–K4 of photo coupler 272 are connected to digital ground 166 and anode terminals A1–A4 are connected to bus outputs 2Y1–2Y4 of octal line driver/buffer 260, respectively, to optically isolate the output to meters 16, 18 and 20. A resistor 281 extends between each anode terminal A1–A4 and driver/buffer 260.

Figure 5E:
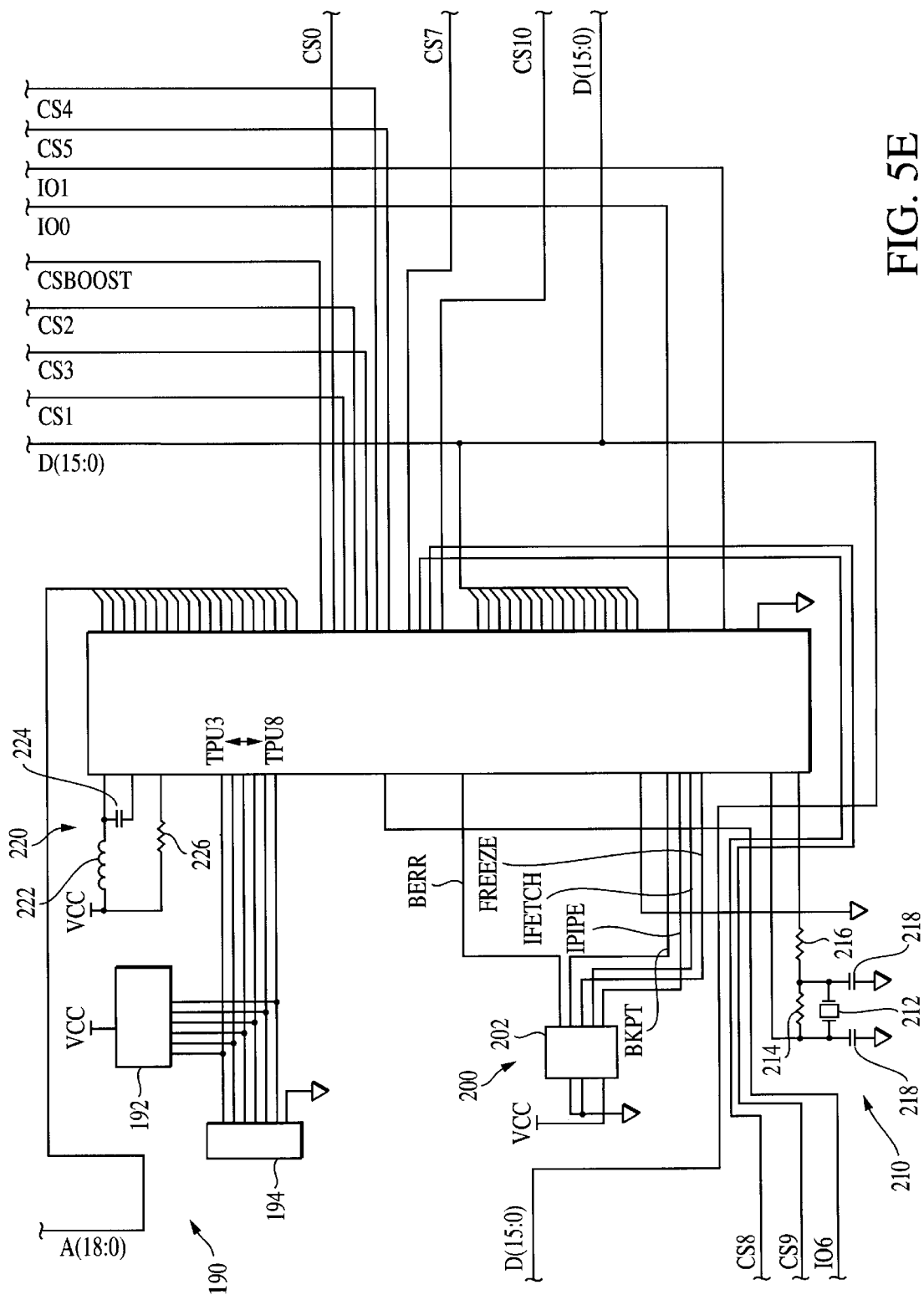
FIG. 5E is a schematic diagram showing the central processing unit of the sub-measurement board.
Figure 5F:
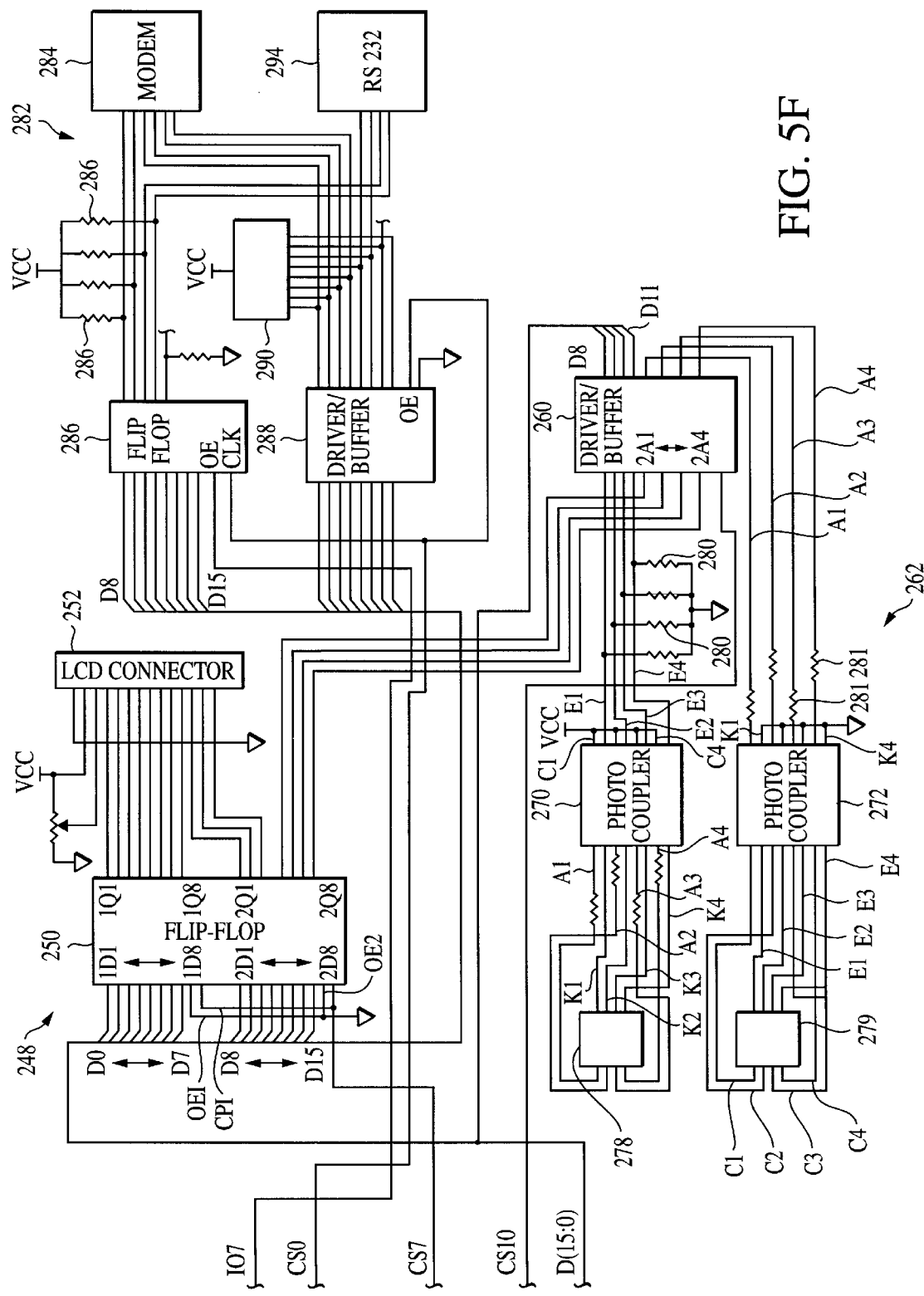
FIG. 5F is a schematic diagram showing optically isolated discrete I/O circuitry, and serial and LCD port circuitry.
Figure 6:
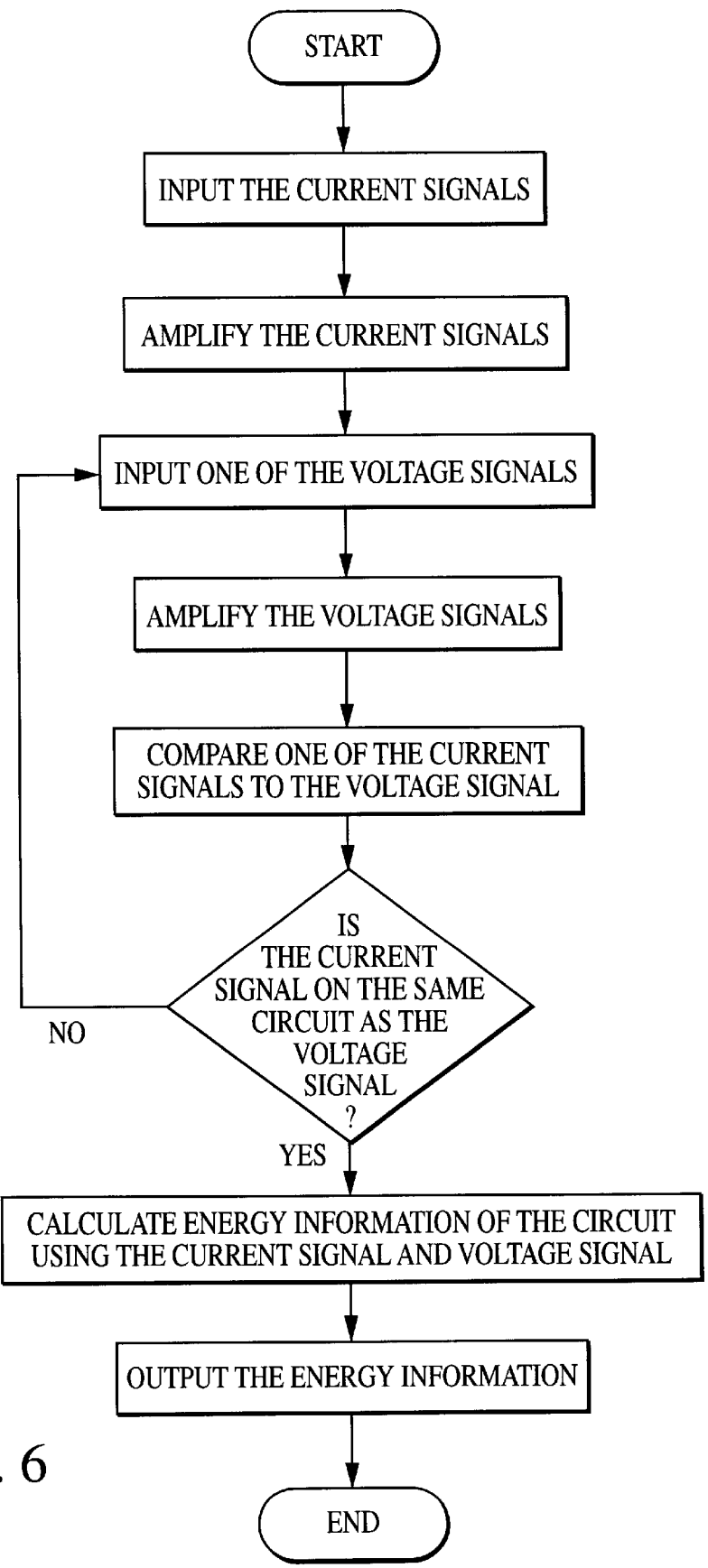
FIG. 6 is a flowchart showing the method of calculating energy information.

In the preferred embodiment, sub-measurement board 10 outputs the load profile data through modem and RS-232 circuit 282 (FIG. 5E). Circuit 282 includes a modem 284 and a RS-232 transceiver 294 which are connected to 16-bit data line D(15:0) through an octal flip-flop 286 and an octal line driver/buffer 288. Flip-flop 286 and driver/buffer 288 both receive bits D8–D15 from 16-bit data line D(15:0) and connect to microprocessor 88 through a chip select line CS0. A 10 k bussed network resistor 290 is connected between the data inputs of driver/buffer 288 and positive supply voltage VCC. Chip select line CS0 connects to the clock input of flip-flop 286 and to an output enable terminal OE of driver/buffer 288. An output enable terminal OE of flip-flop 286 is also connected to microprocessor 88 by an input/output line IO7. Flip-flop 286 connects to modem 284 through outputs Q0 and Q1 and to RS-232 transceiver 294 through outputs Q2 and Q3. Driver/buffer 288 connects to modem 284 through outputs 1A1–1A4 and to RS-232 transceiver 294 through outputs 2A1 and 2A2. A resistor 296 extends between the output lines of flip-flop 286 and the positive supply voltage VCC.

In use, three-phase voltages 56 are input into voltage input amplifier circuitry 74 from distribution panel 14. Each voltage amplifier circuit 96 amplifies the input voltage and outputs this amplified voltage to its respective output line VIN1–VIN3. Likewise, voltages representing single-phase currents 52 are input into current input amplifier circuitry 70 from distribution panel 14. Each current amplifier circuit 120 amplifies the input voltage and outputs an amplified voltage signal. Currents 52 may be input from distribution panel 14 at a relatively high value thus creating a hazardous condition. Currents 52 are input through current transformers 121, the secondary windings of which provide a representative voltage signal to current amplifier circuitry 70. The secondary windings isolate the high currents from sub-measurement board 10 thus drastically reducing any hazardous condition on sub-measurement board 10. Current amplifier circuits 120 output the voltage signals to lines IIN1–IIN9 which are voltage signal that are representative of the current inputs 52.

As stated above, analog multiplexer 140 can only receive eight inputs. Current signals IIN8 and IIN9 are input into switch 142 which outputs one of the two signals depending on the instruction input from microprocessor 88 through line IO6. Microprocessor 88 instructs multiplexer 140 to output one of current signals IIN1–IIN9 to A/D converter 160 based upon the value of lines D0–D2 input into multiplexer 140. In the preferred embodiment, microprocessor 88 will instruct multiplexer 14 to continuously sequence through current signals IIN1–IIN9 alternately outputting a switched current signals to A/D converter 160 during each cycle.

A/D converter 160 receives the switched current signal chosen by multiplexer 140 and the three voltage signals VIN1–VIN3 and converts these four voltages to a 12-bit digital signal D0–D11. A/D converter 160 outputs the digital signal onto 16-bit data line D(15:0) where it is input to flash/memory chip 182. Flash/memory chip 182 is divided into two memory segments. A first memory segment stores the programming code necessary to operate microprocessor 88 and SRAM chips 184 and 186. A second memory segment is used to store the current and voltage signals until the signal are used by microprocessor 88 to calculate the load profile data. SRAM chips 184 and 186 receive the current and voltage data along with software instructions from flash/memory chip 182 necessary to calculate energy usage data such as Watts and VARS. Clock 180 keeps real time including hours, minutes, seconds, and calendar days with leap year compensation. Clock 180 is synchronized to an AC voltage to keep accurate time.

In accordance with another of the features of the invention, by constantly inputting voltage signal VIN1–VIN3 and cycling through current signals IIN1–IIN9, sub-measurement board 10 is able to match a particular current with its current voltage to output actual and accurate real-time voltage, current and power data. The software stored within flash/memory chip 182 allows microprocessor 88 and SRAM chips 184 and 186 to correctly correlate a given current signal with its respective voltage signal. When the current signal is received by microprocessor 88 the current signal is compared with each of the voltage signals providing a matched current and voltage and thus accurate energy consumption calculations.

Microprocessor 88 controls the chip select lines to synchronize the reading and writing of the 16-bit data line D(15:0) and 19-bit address line A(18:0). Flash/memory chip 182 loads the program data into microprocessor 88 necessary for microprocessor 88 to read the voltage and current data from the memory chips, calculate the energy load profile data and store the calculated data back into the memory chips.

Optically isolated discrete I/O circuit 262 isolates the circuitry of sub-measurement board 10 from outside electric and magnetic fields to which sub-measurement board 10 may be exposed. Sub-measurement board is mounted adjacent distribution panel 14 and will be exposed to various electrical switching and power surges. Electric pulses from electric meter 16, gas meter 18 and water meter 20 are input into jumper 278 and photo coupler 270. The meter data is then transferred to the memory chips until accessed by microprocessor 88. The meter data is output from microprocessor 88 and is output through display circuit 248 to LCD 60 when sub-measurement board 10 is prompted therefor by the customer or other user. The load profile data is transferred to modem 284 where it is output to WAN 8 as described above. RS-232 transceiver 294 may be attached to a computer and provides a port for the software instructions to be loaded into flash/memory chip 182.

Accordingly, sub-measurement board 10 measures energy usage of individual circuits of distribution panel 14. Microprocessor 88 compares the one current signal to one of the three voltage signals until microprocessor 88 finds the voltage signal which is connected to the same individual circuit as the one current signal. Microprocessor 88 then calculates the energy usage data and transmits this energy usage load profile to energy information service provider 1. Energy information service provider 1 processes the load profile data and posts the data for access by the customer.

Accordingly, the improved energy information system and sub-measurement board for use therewith is simplified, provides an effective, safe, inexpensive, and efficient apparatus which achieves all the enumerated objectives, provides for eliminating difficulties encountered with prior devices, and solves problems and obtains new results in the art.

In the foregoing description, certain terms have been used for brevity, clearness and understanding; but no unnecessary limitations are to be implied therefrom beyond the requirement of the prior art, because such terms are used for descriptive purposes and are intended to be broadly construed.

Moreover, the description and illustration of the invention is by way of example, and the scope of the invention is not limited to the exact details shown or described.

Having now described the features, discoveries and principles of the invention, the manner in which the improved energy information system and sub-measurement board for use therewith is constructed and used, the characteristics of the construction, and the advantageous, new and useful results obtained; the new and useful structures, devices, elements, arrangements, parts and combinations, are set forth in the appended claims.

What is claimed is:

1. An energy information system which allows an energy information service provider to measure energy usage by a customer at a location, said system comprising:

a sub-measurement board which receives voltage and current signals representative of energy usage at the location, said sub-measurement board outputs a load profile of said energy usage, wherein the sub-measurement board is connected to an energy distribution panel located at the location and receives at least three voltage signals and at least nine current signals from said energy distribution panel;

a wide area communications network connected directly to the sub-measurement board which transfers the load profile to the energy information service provider;

a processor located at the enery information service provider which processes the load profile; and wherein said load profile is accessible for remote viewing by the customer.

2. The system defined in claim 1 further including a current transformer circuit for transforming the current signals into voltage signals which are representative of said at least nine current signals.

3. A method of calculating energy information of individual circuits of an energy distribution panel, said method including the steps of:

inputting a voltage signal from one of a plurality of individual circuits of the energy distribution panel into a sub-measurement board;

inputting a current signal from one of the plurality of individual circuits of the energy distribution panel into the sub-measurement board;

comparing the voltage signal to the current signal to determine whether the voltage signal is connected to the same individual circuit of the energy distribution panel as the current signal;

calculating the energy information of the same individual circuit of the energy distribution panel when the voltage signal and the current signal are connected to said same individual circuit; and outputting the energy information of the same individual circuit to an energy service provider through a wide area network.

4. The method defined in claim 3 further including the step of inputting a plurality of voltage and current signals into the sub-measurement board.

5. The method defined in claim 4 further including the step of inputting each voltage signal of the plurality of voltage signals into a microprocessor circuit of the sub-measurement board; cycling through the plurality of current signals alternately inputting one current signal at a time into the microprocessor circuit; and comparing the one current signal to each voltage signal to determine which of the voltage signals is connected to the same individual circuit as the one current signal.

6. The method defined in claim 3 further including the step of converting the voltage signal into a digital voltage signal and converting the current signal into a digital current signal.

7. The method defined in claim 6 further including the step of inputting the digital current signal and the digital voltage signal into a microprocessor, said microprocessor compares the digital voltage signal to the digital current signal to determine whether the voltage signal is connected to the same individual circuit of the energy distribution panel as the current signal.

8. The method defined in claim 7 further including the step of amplifying the voltage signal prior to converting the voltage signal into the digital voltage signal by inputting the voltage signal into a voltage amplifier circuit.

9. The method defined in claim 8 further including the step of amplifying the current signal prior to converting the current signal into the digital current signal by inputting the current signal into a current amplifier circuit.

10. The method defined in claim 7 further including the step of storing the digital current signal, the digital voltage signal and the energy information in a memory circuit.

11. The method defined in claim 3 further including the step of outputting the energy information to a display.

12. A sub-measurement board for calculating load data of individual circuits of an energy distribution panel, said sub-measurement board including:

a voltage amplifying circuit connected to a voltage terminal of the energy distribution panel for receiving an input voltage signal, said voltage amplifying circuit amplifies the input voltage signal and outputs an amplified voltage signal;

a current amplifying circuit connected to a current terminal of the energy distribution panel for receiving an input current signal, said current amplifying circuit amplifies the input current signal and outputs an amplified current signal;

a switching circuit connected to the current amplifying circuit for receiving the amplified current signal, said switching circuit outputs a switched amplified current signal;

an analog to digital converter connected to the voltage amplifying circuit and the switching circuit for converting the amplified voltage signal into a digital voltage signal and for converting the switched amplified current signal to a digital current signal;

a memory circuit for storing the digital voltage signal and the digital current signal;

a microprocessor connected to the memory circuit for receiving the stored digital voltage signal and digital current signal, said microprocessor calculates the load data of individual circuits of the energy distribution panel; and a display connected to the microprocessor for displaying the calculated load data of the individual circuits of the energy distribution panel, wherein the voltage amplifying circuit is connected to a plurality of voltage terminals of the energy distribution panel for receiving a plurality of input voltage signals, said voltage amplifying circuit amplifies the plurality of input voltage signals and outputs a plurality of amplified voltage signals, wherein the current amplifying circuit is connected to a plurality of current terminals of the energy distribution panel for receiving a plurality of input current signals, said current amplifying circuit amplifies the plurality of input current signals and outputs a plurality of amplified current signals, and wherein the plurality of amplified current signals are input into the switching circuit, said switching circuit cycles through the plurality of amplified current signals to alternately output one amplified current signal of the plurality of amplified current signals to the analog-to-digital converter during each cycle.

13. A sub-measurement board for calculating load data of individual circuits of an energy distribution panel, said sub-measurement board including:

a voltage amplifying circuit connected to a voltage terminal of the energy distribution panel for receiving an input voltage signal, said voltage amplifying circuit amplifies the input voltage signal and outputs an amplified voltage signal;

a current amplifying circuit connected to a current terminal of the energy distribution panel for receiving an input current signal, said current amplifying circuit amplifies the input current signal and outputs an amplified current signal;

a switching circuit connected to the current amplifying circuit for receiving the amplified current signal, said switching circuit outputs a switched amplified current signal;

an analog to digital converter connected to the voltage amplifying circuit and the switching circuit for converting the amplified voltage signal into a digital voltage signal and for converting the switched amplified current signal to a digital current signal;

a memory circuit for storing the digital voltage signal and the digital current signal;

a microprocessor connected to the memory circuit for receiving the stored digital voltage signal and digital current signal, said microprocessor calculates the load data of individual circuits of the energy distribution panel;

a first memory circuit connected to the microprocessor, said first memory circuit stores computer instructions which are loaded into the microprocessor and which instruct the microprocessor to compare the digital current signal to the digital voltage signal and determine whether the digital current signal and digital voltage signals are input into the sub-measurement board from a common individual circuit of the energy distribution panel; and a display connected to the microprocessor for displaying the calculated load data of the individual circuits of the energy distribution panel.

14. The sub-measurement board defined in claim 13 further including a second memory circuit connected to the microprocessor for storing the digital voltage signal, the digital current signal and the calculated load data.

15. A method of calculating energy information of individual circuits of an energy distribution panel, said method including the steps of:

inputting a voltage signal from one individual circuit of a plurality of individual circuits of the energy distribution panel into a sub-measurement board;

inputting a current signal from one individual circuit of the plurality of individual circuits of the energy distribution panel into the sub-measurement board;

comparing the voltage signal to the current signal to determine whether the voltage signal is connected to the same individual circuit of the energy distribution panel as the current signal;

calculating the energy information of the same individual circuit of the energy distribution panel when the voltage signal and the current signal are connected to said same individual circuit; and outputting the energy information of the same individual circuit to a display.

16. An energy information system which allows an energy information service provider to measure energy usage by a customer at a location, said system comprising:

a sub-measurement board which is connected to an energy distribution panel located at the location and receives at least three voltage signals and at least nine current signals representative of energy usage at the location from said energy distribution panel, said sub-measurement board outputs a load profile of said energy usage;

a wide area communications network connected directly to the sub-measurement board which transfers the load profile to the energy information service provider;

a processor located at the energy information service provider which processes the load profile; and wherein said load profile is accessible for remote viewing by the customer.

17. The system of claim 16, wherein the sub-measurement board includes a microprocessor which calculates the energy usage of individual circuits of an energy distribution panel at the location.

* * * * *